(12) United States Patent
Chuang et al.

(10) Patent No.: US 12,527,031 B2
(45) Date of Patent: Jan. 13, 2026

(54) THIN FILM TRANSISTOR STRUCTURE

(71) Applicant: E Ink Holdings Inc., Hsinchu (TW)

(72) Inventors: Ming-Kai Chuang, Hsinchu (TW); Lih-Hsiung Chan, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 477 days.

(21) Appl. No.: 18/323,424

(22) Filed: May 25, 2023

(65) Prior Publication Data

US 2024/0014277 A1    Jan. 11, 2024

(30) Foreign Application Priority Data

Jul. 11, 2022   (TW) .................................. 111125853

(51) Int. Cl.
*H10D 30/67*    (2025.01)

(52) U.S. Cl.
CPC ....... *H10D 30/6729* (2025.01); *H10D 30/673* (2025.01); *H10D 30/6746* (2025.01)

(58) Field of Classification Search
CPC ............. H10D 30/6729; H10D 30/673; H10D 30/6746; H10D 30/6757; H10D 30/0316; H10D 30/0321
See application file for complete search history.

(56) References Cited

U.S. PATENT DOCUMENTS

| | | |
|---|---|---|
| 4,984,040 A | 1/1991 | Yap |
| 4,984,041 A | 1/1991 | Hack et al. |
| 7,423,309 B2 | 9/2008 | Park et al. |
| 7,807,486 B2 | 10/2010 | Kwack |
| 9,576,797 B2 | 2/2017 | Lee et al. |
| 2018/0097120 A1* | 4/2018 | Ishida ................ H10D 30/6706 |

FOREIGN PATENT DOCUMENTS

| | | |
|---|---|---|
| TW | 201933611 A | 8/2019 |
| WO | 2012005030 A1 | 1/2012 |

OTHER PUBLICATIONS

The office action of corresponding TW application No. 111125853 issued on Apr. 24, 2023.

* cited by examiner

*Primary Examiner* — Mohammad A Rahman
(74) *Attorney, Agent, or Firm* — CKC & Partners Co., LLC (57) ABSTRACT

A thin film transistor structure includes a gate electrode, a gate insulation layer, a first amorphous silicon layer, a source/drain electrode, and a second amorphous silicon layer. The gate insulation layer is located on the gate electrode. The first amorphous silicon layer is located on the gate insulation layer. The source/drain electrode is located on the first amorphous silicon layer. The second amorphous silicon layer is located in the gate insulation layer.

16 Claims, 10 Drawing Sheets

THIN FILM TRANSISTOR STRUCTURE

CROSS-REFERENCE TO RELATED APPLICATION

This application claims priority to Taiwan Application Serial Number 111125853, filed Jul. 11, 2022, which is herein incorporated by reference in its entirety.

BACKGROUND

Field of Invention

The present invention relates to a thin film transistor.

Description of Related Art

Leakage current problem occur when the amorphous silicon thin film transistor in a display device is under high voltage. A common resolution is by modulating reference voltage, using two thin film transistors serially connected or providing extra electrodes. However, those methods may cause efficiency reduction, low charging rate of the storage capacity or cost increasing problems.

Accordingly, how to provide a thin film transistor structure that can avoid leakage current problem under high voltage as described above is still one of the develop direction for those in the industry.

SUMMARY

One aspect of the present disclosure provides a thin film transistor structure.

In one embodiment of the present disclosure, the thin film transistor structure includes a gate electrode, a gate insulation layer located on the gate electrode, a first amorphous silicon layer located on the gate insulation layer, a source/drain electrode located on the first amorphous silicon layer, and a second amorphous silicon layer located in the gate insulation layer.

In one embodiment of the present disclosure, an orthogonal projection of the second amorphous silicon layer on the gate insulation layer is within an orthogonal projection of the first amorphous silicon layer on the gate insulation layer.

In one embodiment of the present disclosure, the second amorphous silicon layer at least partially overlaps the gate electrode in a vertical direction.

In one embodiment of the present disclosure, the gate insulation layer includes a top surface facing the first amorphous silicon layer and a bottom surface facing the gate electrode. The second amorphous silicon layer and the top surface have a first distance therebetween. The top surface and the bottom surface of the gate insulation layer have a second distance therebetween. The first distance is smaller than 50% of the second distance.

In one embodiment of the present disclosure, the gate electrode and the source/drain electrode have a channel region therebetween. The channel region includes a channel length extending in a first direction and a channel width extending in a second direction, and a total length of the second amorphous silicon layer in the second direction is greater than a total length of the second amorphous silicon layer in the first direction.

In one embodiment of the present disclosure, the second amorphous silicon layer has a strip shape, and an extension direction of the second amorphous silicon layer is parallel with the second direction.

In one embodiment of the present disclosure, the second amorphous silicon layer has a strip shape, and an extension direction of the second amorphous silicon layer and the second direction form an angle, and the angle is smaller than 90 degrees.

In one embodiment of the present disclosure, the second amorphous silicon layer includes multiple sections.

In one embodiment of the present disclosure, the sections are arranged in the first direction.

In one embodiment of the present disclosure, the sections are arranged in the second direction.

In one embodiment of the present disclosure, the sections are arranged in the first direction and in the second direction.

In one embodiment of the present disclosure, the second amorphous silicon layer at least partially overlaps the source/drain electrode in a vertical direction.

Another aspect of the present disclosure is a thin film transistor structure.

In one embodiment of the present disclosure, the thin film transistor structure includes a gate electrode, a gate insulation layer located on the gate electrode, a first amorphous silicon layer located on the gate insulation layer, a source electrode located on the first amorphous silicon layer, a drain electrode located on the first amorphous silicon layer, and a second amorphous silicon layer. The gate insulation layer includes a top portion and a bottom portion, and the bottom portion is located between the top portion and the gate electrode. The source electrode and the drain electrode are arranged in a first direction. The second amorphous silicon layer is located between the top portion and the bottom portion of the gate insulation layer.

In one embodiment of the present disclosure, an orthogonal projection of the second amorphous silicon layer on the bottom portion of the gate insulation layer is within a range of an orthogonal projection of the first amorphous silicon layer on the bottom portion of the gate insulation layer.

In one embodiment of the present disclosure, a thickness of the top portion of the gate insulation layer is smaller than a thickness of the bottom portion of the gate insulation layer.

In one embodiment of the present disclosure, a total length of the second amorphous silicon layer in a second direction is greater than a total width of the second amorphous silicon layer in the first direction, and the second direction is perpendicular with the first direction.

In the aforementioned embodiments, the thin film transistor structure of the present disclosure can reduce leakage current by disposing the second amorphous silicon layer in the gate insulation layer.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
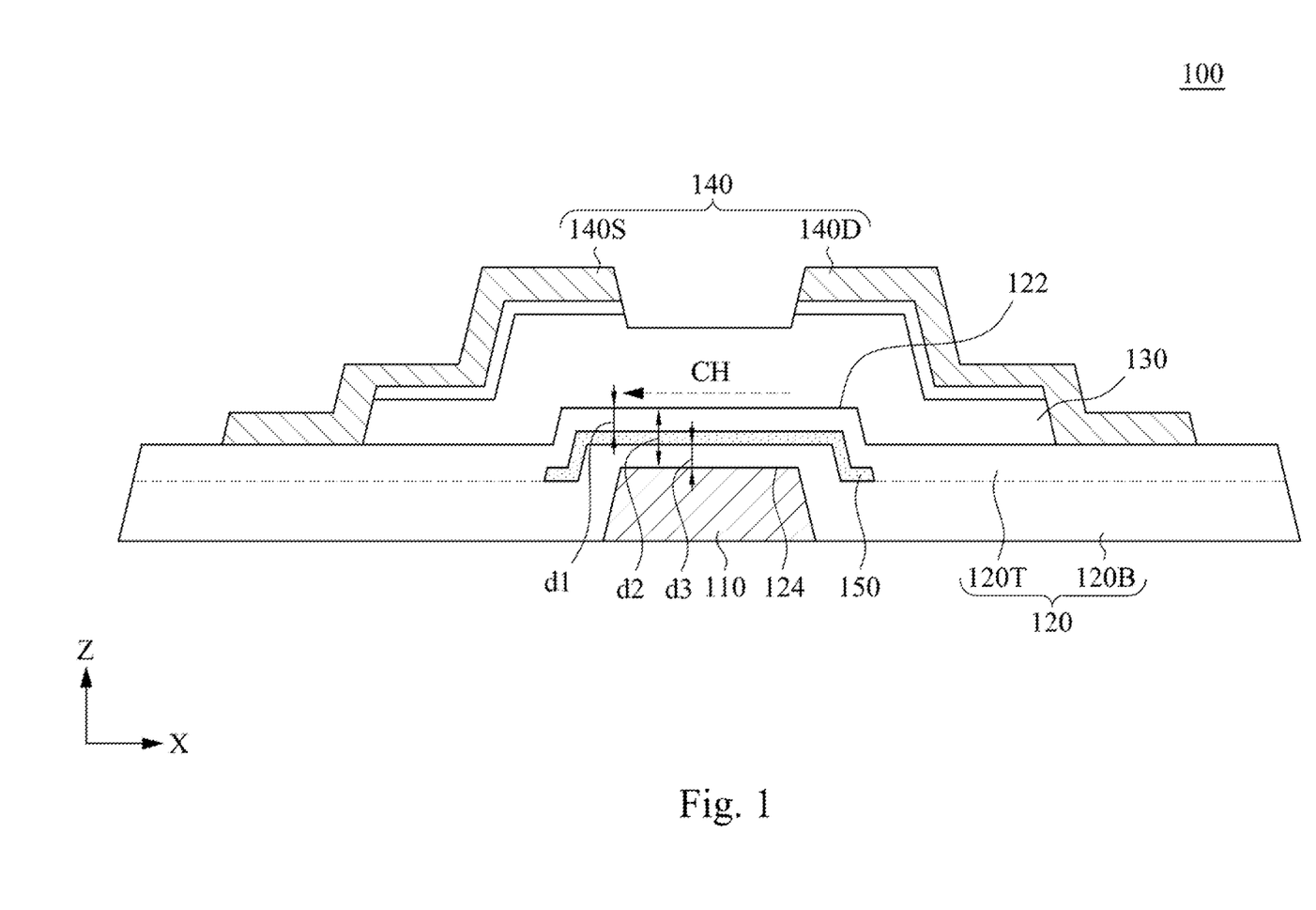
FIG. 1 is a cross-sectional view of a thin film transistor structure taken along line 1-1 in FIG. 2 according to one embodiment of the present disclosure.
Figure 2:
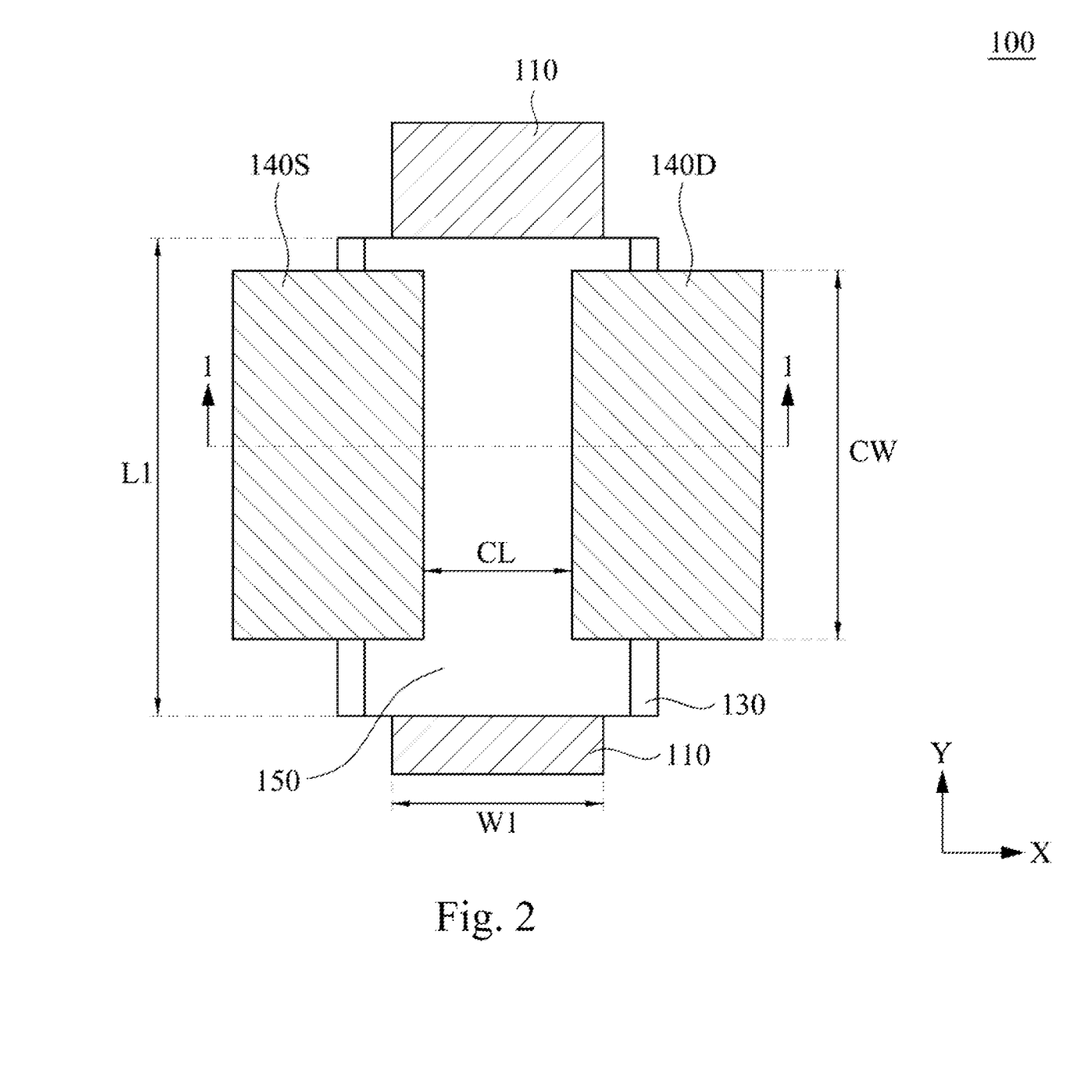
FIG. 2 is a top view of the thin film transistor structure in FIG. 1.

FIG. 1 is a cross-sectional view of a thin film transistor structure 100 taken along line 1-1 in FIG. 2 according to one embodiment of the present disclosure. FIG. 2 is a top view of the thin film transistor structure 100 in FIG. 1. Reference is made to FIG. 1 and FIG. 2 simultaneously. The thin film transistor structure 100 includes a gate electrode 110, a gate insulation layer 120, a first amorphous silicon layer 130, a source/drain electrode 140, and a second amorphous silicon layer 150. For convenience, only the gate electrode 110, the first amorphous silicon layer 130, and the source/drain electrode 140 are shown in the top view, and the second amorphous silicon layer 150 are indicated by solid lines.

Reference is made to FIG. 1. The gate insulation layer 120 is located on the gate electrode 110. The first amorphous silicon layer 130 is located on the gate insulation layer 120. The gate insulation layer 120 separates the gate electrode 110 and the first amorphous silicon layer 130. The source/drain electrode 140 is located on the first amorphous silicon layer 130. The second amorphous silicon layer 150 is located in the gate insulation layer 120. In other words, the second amorphous silicon layer 150 is sandwiched in the gate insulation layer 120. In the present embodiment, the left hand side of the source/drain electrode 140 is a source electrode 140S, and the right hand side of the source/drain electrode 140 is a drain electrode 140D. The source electrode 140S and the drain electrode 140D are arranged in a first direction X. The second amorphous silicon layer 150 at least partially overlaps the gate electrode 110 long a vertical direction Z. As shown in FIG. 1, in the present embodiment, the second amorphous silicon layer 150 completely overlaps the gate electrode 110 along the vertical direction Z. The second amorphous silicon layer 150 also overlaps the source/drain electrode 140 along the vertical direction Z to enhance the ability of reducing leakage current. In other embodiment, the second amorphous silicon layer 150 does not overlap the source/drain electrode 140 along the vertical direction Z.

Reference is made to FIG. 2. An orthogonal projection of the second amorphous silicon layer 150 on the gate insulation layer 120 is within an orthogonal projection of the first amorphous silicon layer 130 on the gate insulation layer 120. In other words, a size of the range of the second amorphous silicon layer 150 is smaller or equals to a size of the range of the first amorphous silicon layer 130.

Reference is made to FIG. 1. The thin film transistor structure 100 further includes a channel region CH located between the gate electrode 110 and the source/drain electrode 140. When the thin film transistor structure 100 is under high voltage, the high voltage difference between the gate electrode 110 and the drain electrode 140D produces electron-hole pairs. As a result, a hole current flows towards the source electrode 140S is formed, and therefore produces the leakage current. The thin film transistor structure 100 of the present disclosure can release electrons to neutralize the electron-hole pairs to by recombine the hole in the hole current under high voltage by disposing the second amorphous silicon layer 150 in the gate insulation layer 120. Therefore, it is beneficial to reducing the leakage current.

Reference is made to FIG. 1. The gate insulation layer 120 can be divided as a top portion 120T and a bottom portion 120B. The second amorphous silicon layer 150 is separated from the first amorphous silicon layer 130 by the top portion 120T of the gate insulation layer 120. The gate insulation layer 120 has a top surface 122 facing the first amorphous silicon layer 130 and a bottom surface 124 facing the gate electrode 110. The second amorphous silicon layer 150 and the top surface 122 have a distance d1 therebetween. The top surface 122 and the bottom surface 124 of the gate insulation layer 120 have a second distance d2 therebetween. The second amorphous silicon layer 150 and the bottom surface 124 have a third distance d3 therebetween.

The first direction d1 equals to a depth of the position of the second amorphous silicon layer 150 in the gate insulation layer 120, or equals to a thickness of the top portion 120T. The second distance d2 equals to a total thickness of the gate insulation layer 120 and the second amorphous silicon layer 150. The first distance d1 is smaller than 50% of the second distance d2. In other words, the depth of the position of the second amorphous silicon layer 150 is above the position corresponding to 50% of the total thickness of the gate insulation layer 120 and the second amorphous silicon layer 150. For example, in some embodiments, the total thickness of the gate insulation layer 120 is about 650 nm, and the first distance d1 is about 300 nm. The present disclosure is not limited thereto. Specifically, the ability of reducing leakage current is improved as long as the second amorphous silicon layer 150 and the gate insulation layer 120 can be separated by the top portion 120T, and the second amorphous silicon layer 150 is close enough to the first amorphous silicon layer 130. The third distance d3 equals to the thickness of the bottom portion 120B. In some embodiments, the thickness of the top portion 120T (first distance d1) is smaller than the thickness of the bottom portion 120B (third distance d3).

Reference is made to FIG. 1 and FIG. 2. The channel region CH includes a channel length CL extending in a first direction X and a channel width CW extending in a second direction Y. The second amorphous silicon layer 150 has a total length L1 in the second direction Y, and the second amorphous silicon layer 150 has a total width W1 in the first direction X. The total length L1 of the second amorphous silicon layer 150 is greater than the total width W1. The second amorphous silicon layer 150 has a strip shape. In other words, an extension direction of the second amorphous silicon layer 150 is parallel with an extension direction of the channel width CW. The ability of reducing the leakage current of the second amorphous silicon layer 150 is improved by extending the second amorphous silicon layer 150 in the second direction Y.

Figure 3:
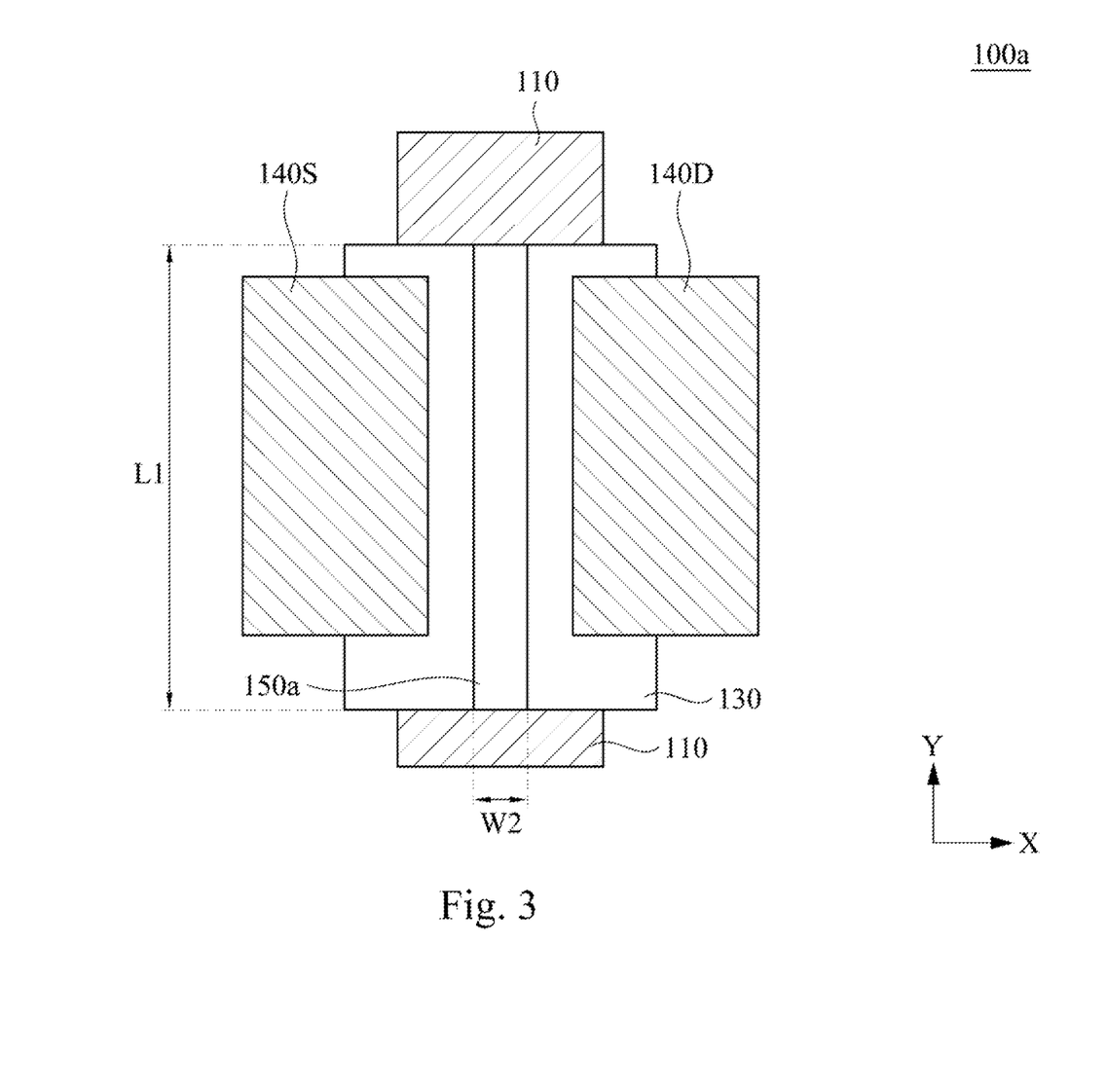
FIG. 3 is a top view of a thin film transistor structure according to another embodiment of the present disclosure.

FIG. 3 is a top view of a thin film transistor structure 100a according to another embodiment of the present disclosure. The thin film transistor structure 100a is similar to the thin film transistor structure 100, and the difference is that the total width W2 of the second amorphous silicon layer 150a of the thin film transistor structure 100a is narrower. In other words, the width of the second amorphous silicon layer 150a in the first direction X is reduced such that the second amorphous silicon layer 150a is more elongated.

Figure 4:
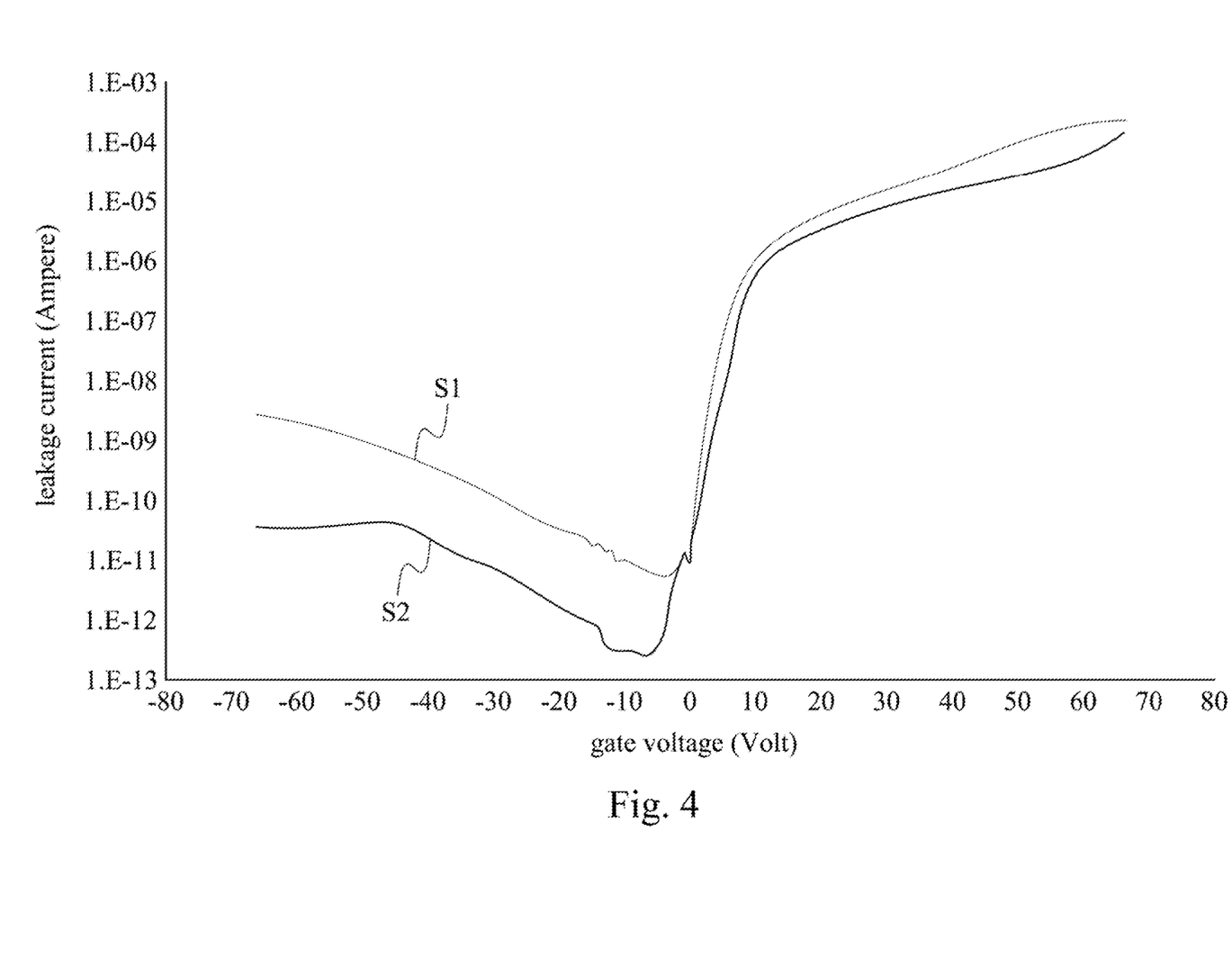
FIG. 4 is relation figure of leakage current and gate voltage of the thin film transistor in FIG. 3.

FIG. 4 is relation figure of leakage current and gate voltage of the thin film transistor in FIG. 3. Curve S1 indicates a control group corresponding to a thin film transistor without second amorphous silicon layer. Curve S2 indicates the thin film transistor structure 100a. It can be seen from FIG. 4 that the leakage current can be reduced when the thin film transistor structure 100a is under high voltage by disposing the second amorphous silicon layer 150a extending in the second direction Y.

Figure 5:
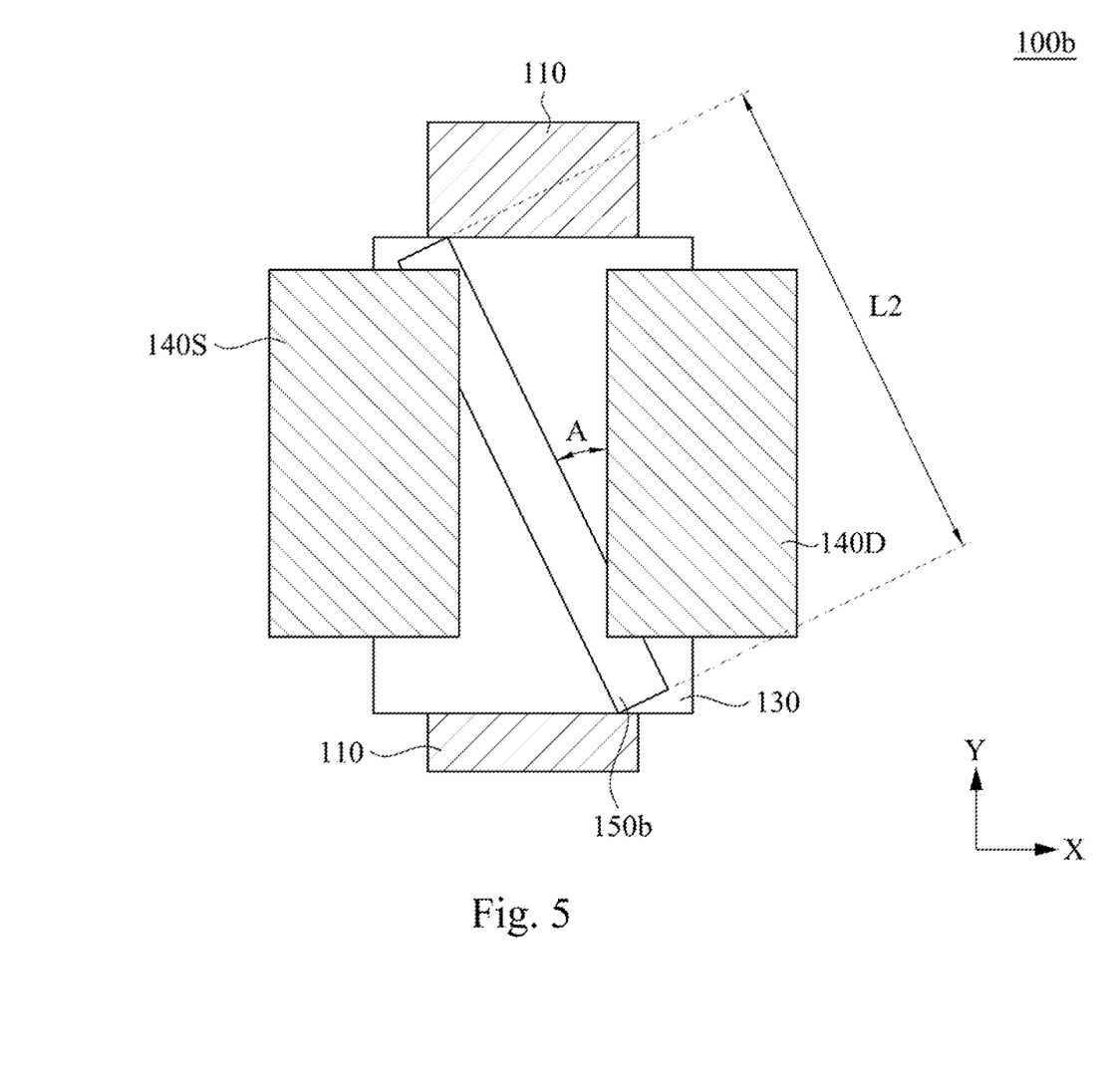
FIG. 5 is a top view of a thin film transistor structure according to another embodiment of the present disclosure.

FIG. 5 is a top view of a thin film transistor structure 100b according to another embodiment of the present disclosure. The thin film transistor structure 100b is similar to the thin film transistor structure 100a in FIG. 3, and the difference is that the extending direction of the second amorphous silicon layer 150b of the thin film transistor structure 100b and the second direction Y form an angle A, and the angle A is smaller than 90 degrees. In other words, the second amorphous silicon layer 150b is an inclined strip. The total length L2 of the second amorphous silicon layer 150b is greater than the total length L1. In the present embodiment, the total length of the second amorphous silicon layer 150b in the second direction Y is the same as the total length L1 of the second amorphous silicon layer 150, and the total length of the second amorphous silicon layer 150b in the second direction Y is greater than a total width of the second amorphous silicon layer 150b in the first direction X. As described above, the ability of reducing the leakage current of the second amorphous silicon layer 150 is improved by extending the second amorphous silicon layer 150b in the second direction Y.

Figure 6:
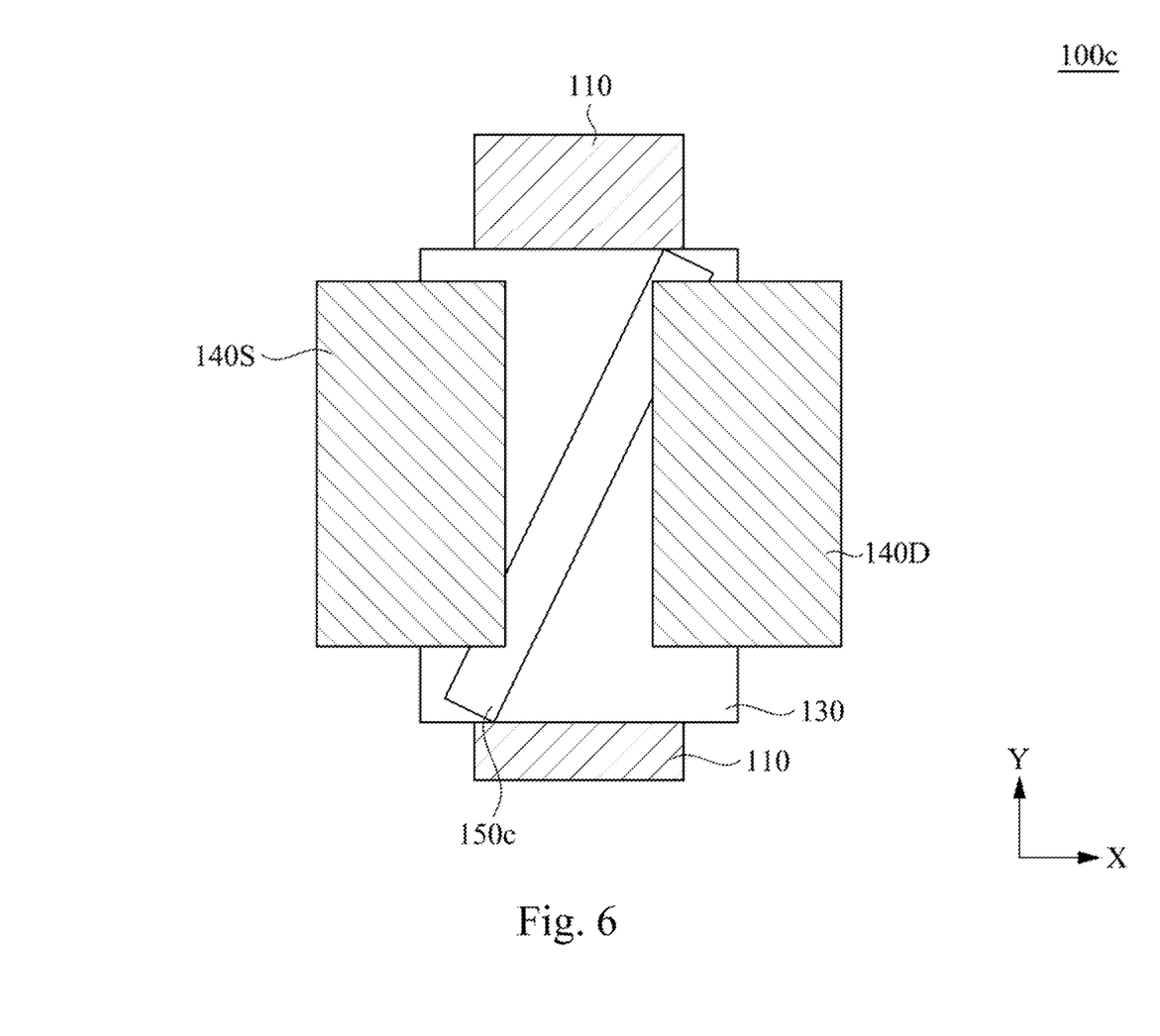
FIG. 6 is a top view of a thin film transistor structure according to another embodiment of the present disclosure.

FIG. 6 is a top view of a thin film transistor structure 100c according to another embodiment of the present disclosure. The thin film transistor structure 100c is similar to the thin film transistor structure 100b in FIG. 5, and the difference is that the direction of inclination of the second amorphous silicon layer 150c of the thin film transistor structure 100c is different. In other words, the extending direction of the second amorphous silicon layer 150c and the second direction Y may have the same angle as shown in FIG. 5, but the present disclosure is not limited thereto. The thin film transistor structure 100c have the same advantages as those of the thin film transistor structure 100, and therefore the description is not repeated hereinafter.

Figure 7:
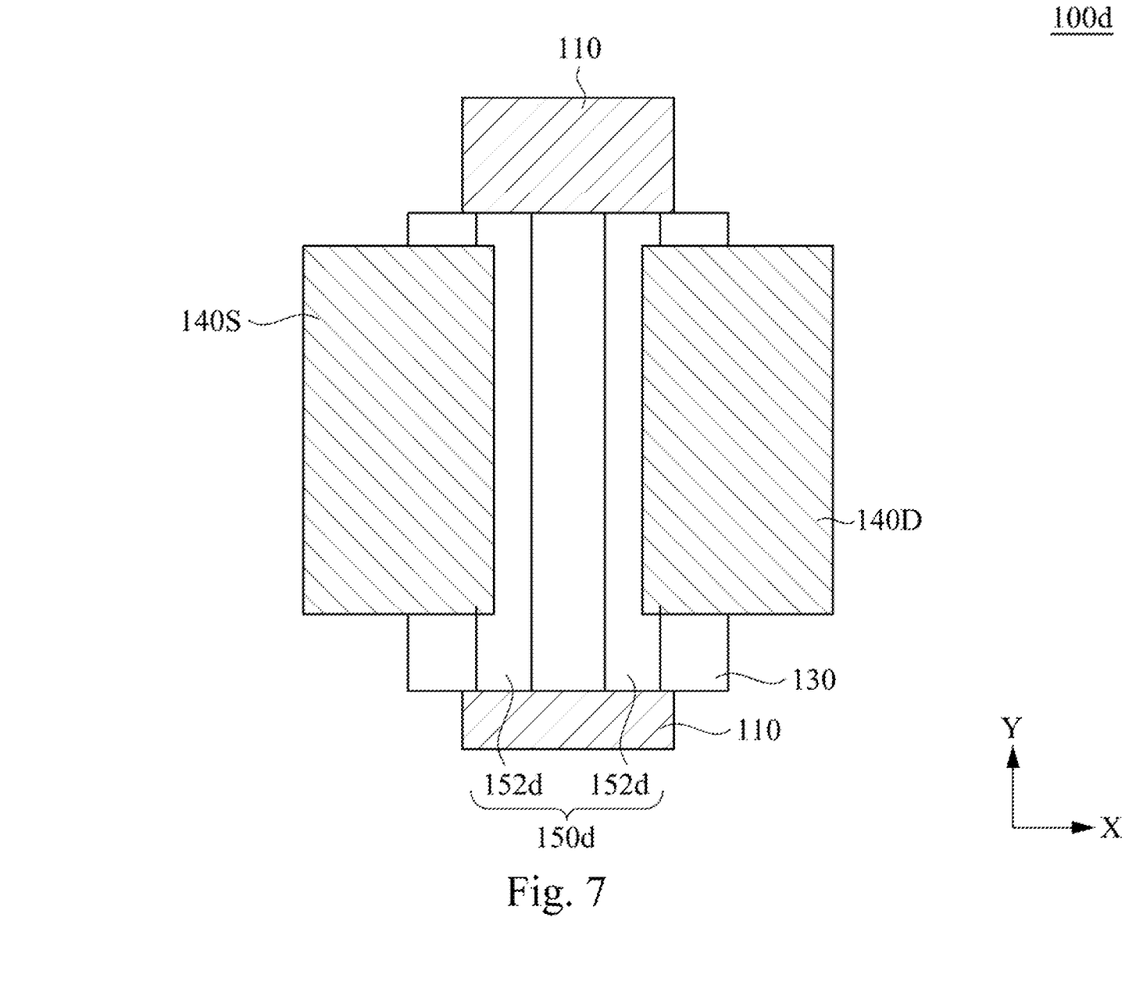
FIG. 7 is a top view of a thin film transistor structure according to another embodiment of the present disclosure.

FIG. 7 is a top view of a thin film transistor structure 100d according to another embodiment of the present disclosure. The thin film transistor structure 100d is similar to the thin film transistor structure 100a in FIG. 3, and the difference is that the second amorphous silicon layer 150d of the thin film transistor structure 100d has multiple sections 152d. Two sections 152d are demonstrated in the present embodiment. The sections 152d have strip shape and extend in the second direction Y. The sections 152d are arranged in the first direction X. A sum of the widths of the sections 152d in the first direction X is the total width of the second amorphous silicon layer 150d. A sum of the lengths of the sections 152d in the second direction Y is the total width of the second amorphous silicon layer 150d. The total length of the second amorphous silicon layer 150d in the second direction Y is greater than a total width of the second amorphous silicon layer 150d in the first direction X. In the present embodiment, the two sections 152d have same size and shape. In other embodiment, the sections 152d can have different lengths and widths. The thin film transistor structure 100d have the same advantages as those of the thin film transistor structure 100a, and therefore the description is not repeated hereinafter.

Figure 8:
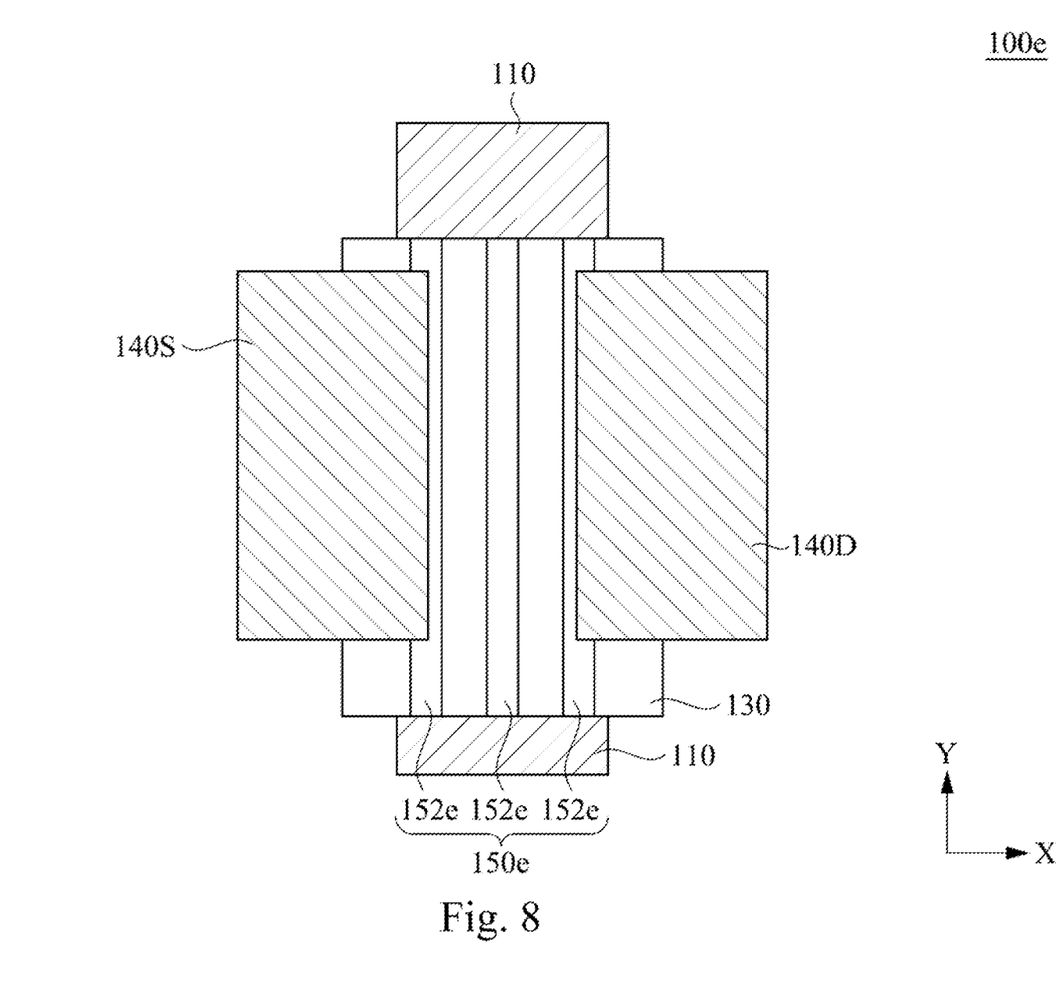
FIG. 8 is a top view of a thin film transistor structure according to another embodiment of the present disclosure.

FIG. 8 is a top view of a thin film transistor structure 100e according to another embodiment of the present disclosure. The thin film transistor structure 100e is similar to the thin film transistor structure 100d in FIG. 7, and the difference is that the second amorphous silicon layer 150e of the thin film transistor structure 100e has three sections 152e. The sections 152e have strip shape and extend in the second direction Y. A sum of the widths of the sections 152e in the first direction X is the total width of the second amorphous silicon layer 150e. A total length of the second amorphous silicon layer 150e in the second direction Y is greater than a total width of the second amorphous silicon layer 150e in the first direction X. In the present embodiment, the two sections 152e have same size and shape. In other embodiment, the sections 152d can have different lengths and widths. The thin film transistor structure 100e have the same advantages as those of the thin film transistor structure 100d, and therefore the description is not repeated hereinafter.

Figure 9:
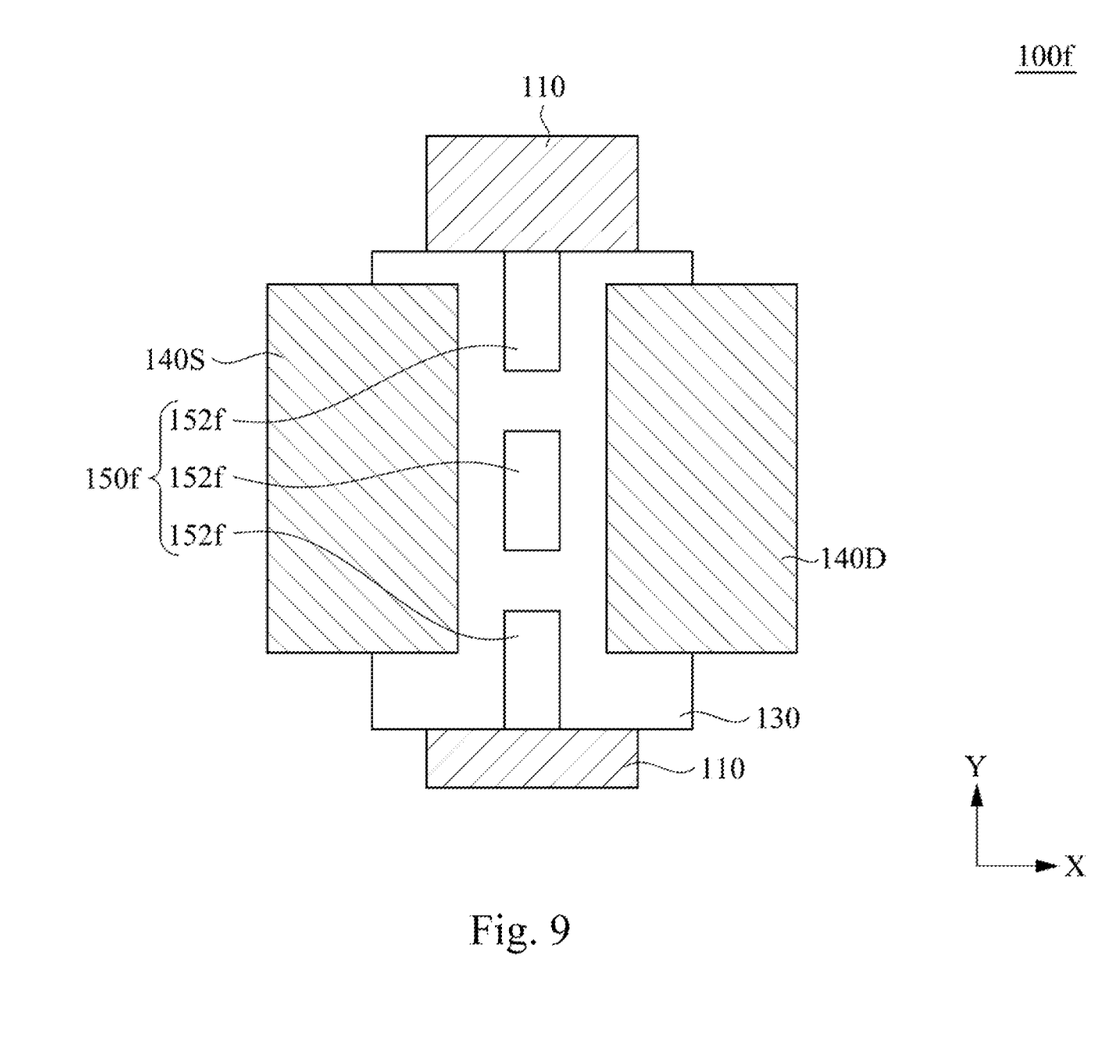
FIG. 9 is a top view of a thin film transistor structure according to another embodiment of the present disclosure.

FIG. 9 is a top view of a thin film transistor structure 100f according to another embodiment of the present disclosure. The thin film transistor structure 100f is similar to the thin film transistor structure 100a in FIG. 3, and the difference is that the second amorphous silicon layer 150f of the thin film transistor structure 100f has multiple sections 152f. In the present embodiment, three sections 152f are demonstrated. The sections 152f have strip shape and extend in the second direction Y. The sections 152f are arranged in the second direction Y. A sum of the lengths of the sections 152f in the second direction Y is the total length of the second amorphous silicon layer 150f. The total length of the second amorphous silicon layer 150f in the second direction Y is greater than the total width of the second amorphous silicon layer 150f in the first direction X. In the present embodiment, the three sections 152f have same size and shape. In other embodiment, the sections 152f can have different lengths and widths. The thin film transistor structure 100f have the same advantages as those of the thin film transistor structure 100a, and therefore the description is not repeated hereinafter.

Figure 10:
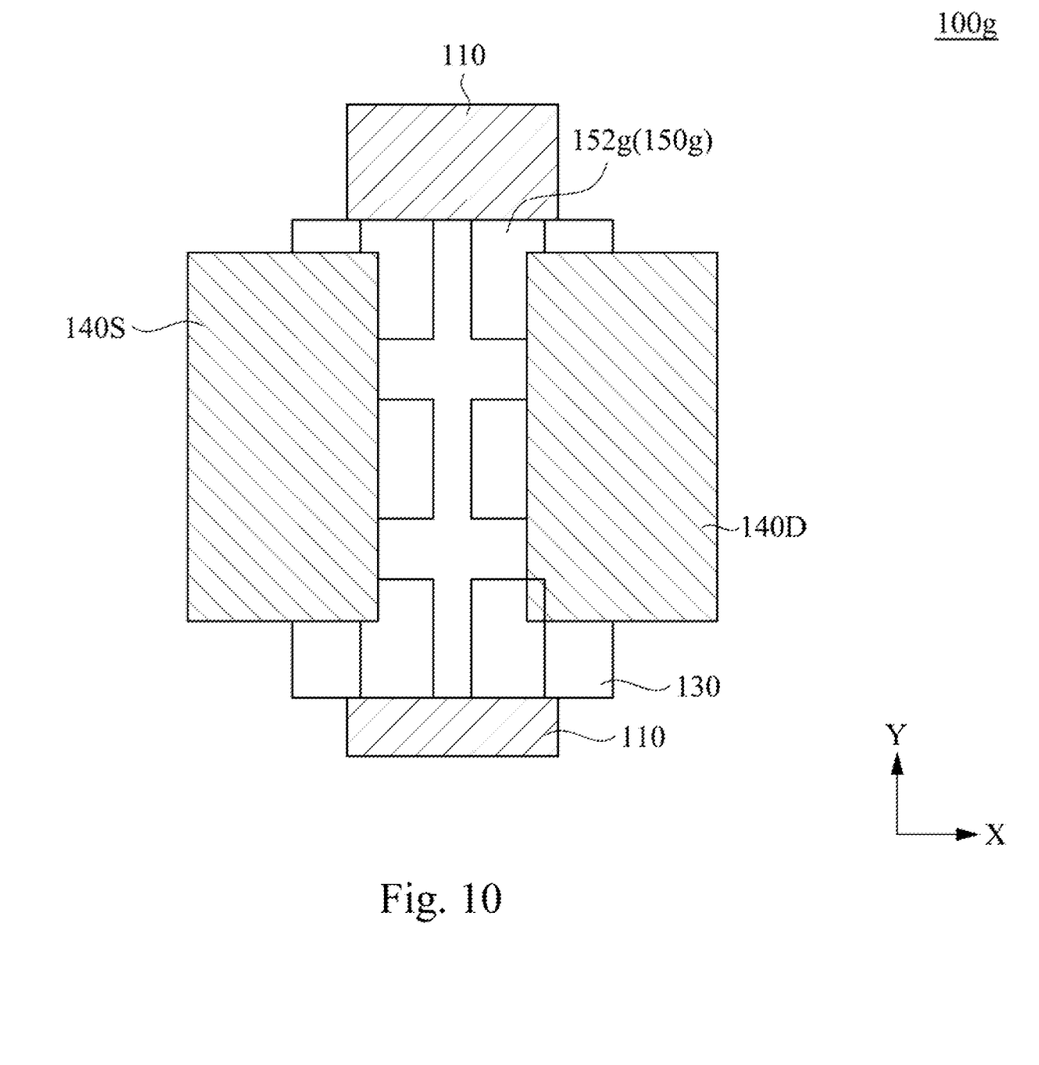
FIG. 10 is a top view of a thin film transistor structure according to another embodiment of the present disclosure.

FIG. 10 is a top view of a thin film transistor structure 100g according to another embodiment of the present disclosure. The thin film transistor structure 100g is similar to the thin film transistor structure 100a in FIG. 3, and the difference is that the second amorphous silicon layer 150g of the thin film transistor structure 100g has multiple sections 152g, and the sections 152g are arranged both in the first direction X and the second direction Y. A total length of the second amorphous silicon layer 150g in the second direction Y is greater than a total width of the second amorphous silicon layer 150g in the first direction X. In the present embodiment, the six sections 152g have same size and shape. In other embodiment, the sections 152g can have different lengths and widths. The thin film transistor structure 100g have the same advantages as those of the thin film transistor structure 100a, and therefore the description is not repeated hereinafter.

In summary, the thin film transistor structure of the present disclosure can reduce leakage current by disposing the second amorphous silicon layer in the gate insulation layer. In addition, the ability of reducing the leakage current of the second amorphous silicon layer is improved by extending the second amorphous silicon layer in the second direction (the extension direction of the channel width of the channel region). The depth of the position of the second amorphous silicon layer in the gate insulation layer is above the position corresponding to 50% of the total thickness of the gate insulating layer and the second amorphous silicon layer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A thin film transistor structure, comprising:
   a gate electrode;
   a gate insulation layer located on the gate electrode;
   a first amorphous silicon layer located on the gate insulation layer;
   a source/drain electrode located on the first amorphous silicon layer; and
   a second amorphous silicon layer located in the gate insulation layer.

2. The thin film transistor structure of claim 1, wherein an orthogonal projection of the second amorphous silicon layer on the gate insulation layer is within an orthogonal projection of the first amorphous silicon layer on the gate insulation layer.

3. The thin film transistor structure of claim 1, wherein the second amorphous silicon layer at least partially overlaps the gate electrode in a vertical direction.

4. The thin film transistor structure of claim 1, wherein the gate insulation layer comprises a top surface facing the first amorphous silicon layer and a bottom surface facing the gate electrode, and wherein the second amorphous silicon layer and the top surface have a first distance therebetween, the top surface and the bottom surface of the gate insulation layer have a second distance therebetween, and the first distance is smaller than 50% of the second distance.

5. The thin film transistor structure of claim 1, wherein the gate electrode and the source/drain electrode have a channel region therebetween, the channel region comprises a channel length extending in a first direction and a channel width extending in a second direction, and a total length of the second amorphous silicon layer in the second direction is greater than a total length of the second amorphous silicon layer in the first direction.

6. The thin film transistor structure of claim 5, wherein the second amorphous silicon layer has a strip shape, and an extension direction of the second amorphous silicon layer is parallel with the second direction.

7. The thin film transistor structure of claim 5, wherein the second amorphous silicon layer has a strip shape, and an extension direction of the second amorphous silicon layer and the second direction form an angle, and the angle is smaller than 90 degrees.

8. The thin film transistor structure of claim 5, wherein the second amorphous silicon layer comprises a plurality of sections.

9. The thin film transistor structure of claim 8, wherein the sections are arranged in the first direction.

10. The thin film transistor structure of claim 8, wherein the sections are arranged in the second direction.

11. The thin film transistor structure of claim 8, wherein the sections are arranged in the first direction and in the second direction.

12. The thin film transistor structure of claim 8, wherein the second amorphous silicon layer at least partially overlaps the source/drain electrode in a vertical direction.

13. A thin film transistor structure, comprising:
    a gate electrode;
    a gate insulation layer located on the gate electrode, wherein the gate insulation layer comprises a top portion and a bottom portion, and the bottom portion is located between the top portion and the gate electrode;
    a first amorphous silicon layer located on the gate insulation layer;
    a source electrode located on the first amorphous silicon layer;
    a drain electrode located on the first amorphous silicon layer, and the source electrode and the drain electrode are arranged in a first direction; and
    a second amorphous silicon layer located between the top portion and the bottom portion of the gate insulation layer.

14. The thin film transistor structure of claim 13, wherein an orthogonal projection of the second amorphous silicon layer on the bottom portion of the gate insulation layer is within a range of an orthogonal projection of the first amorphous silicon layer on the bottom portion of the gate insulation layer.

15. The thin film transistor structure of claim 13, wherein a thickness of the top portion of the gate insulation layer is smaller than a thickness of the bottom portion of the gate insulation layer.

16. The thin film transistor structure of claim 13, wherein a total length of the second amorphous silicon layer in a second direction is greater than a total width of the second amorphous silicon layer in the first direction, and the second direction is perpendicular with the first direction.

* * * * *